US012763721B2

(12) United States Patent
Ju et al.

(10) Patent No.: US 12,763,721 B2
(45) Date of Patent: Oct. 13, 2026

(54) SOLAR POWER GENERATOR FOR FORMING UNIFORM FOCAL REGION

(71) Applicant: FOODPORT CO., LTD., Sejong (KR)

(72) Inventors: Yong Jea Ju, Sejong (KR); Hyun Il Cho, Cheongju-si (KR); Byeong Do Kang, Sejong (KR); Min Cheol Park, Sejong (KR); Chung Hee Lee, Sejong (KR); Raju Timalsina, Sejong (KR); Jin A Choe, Sejong (KR)

(73) Assignee: FOODPORT CO., LTD., Sejong (KR)

( * ) Notice: Subject to any disclaimer, the term of this patent is extended or adjusted under 35 U.S.C. 154(b) by 0 days.

(21) Appl. No.: 19/263,538

(22) Filed: Jul. 9, 2025

(65) Prior Publication Data

US 2025/0337354 A1 Oct. 30, 2025

Related U.S. Application Data

(62) Division of application No. 18/575,311, filed as application No. PCT/KR2021/016694 on Nov. 16, 2021, now Pat. No. 12,395,121.

(30) Foreign Application Priority Data

Aug. 11, 2021 (KR) ........................ 10-2021-0105804

(51) Int. Cl.
*H02S 40/22* (2014.01)
*H02S 40/32* (2014.01)
*H02S 50/00* (2014.01)
*G06N 20/00* (2019.01)
*H10F 77/42* (2025.01)

(52) U.S. Cl.
CPC .............. *H02S 40/22* (2014.12); *H02S 40/32* (2014.12); *H02S 50/00* (2013.01); *G06N 20/00* (2019.01); *H10F 77/42* (2025.01); *H10F 77/484* (2025.01); *H10F 77/488* (2025.01)

(58) Field of Classification Search
CPC .......... H02S 40/22; H02S 40/32; H02S 50/00; G06N 20/00; H10F 77/42; H10F 77/484; H10F 77/488; Y02E 10/52
See application file for complete search history.

(56) References Cited

U.S. PATENT DOCUMENTS

2012/0266938 A1* 10/2012 Goei .................... F24S 30/452 136/246
2016/0268968 A1* 9/2016 Demers .................. F24S 25/00

FOREIGN PATENT DOCUMENTS

JP 2018011459 A 1/2018
KR 20110139290 A 12/2011
KR 20180072377 A 6/2018
WO 2006110739 A2 10/2006
WO 2007121971 A1 11/2007

* cited by examiner

*Primary Examiner* — Michael Y Sun
(74) *Attorney, Agent, or Firm* — NKL Law; Jae Youn Kim

(57) ABSTRACT

A solar power generator for forming a uniform focal region is proposed. The proposed relates to a solar power generator for forming a uniform focal region and, more particularly, to a solar power generator for forming a uniform focal region and, the solar power generator being capable of forming the uniform focal region in a specific area with an infinite number of focuses by reflected sunlight, controlling the focal region by adjusting an angle and width according to position changes of the focal region due to optical path distortion, and controlling generated power according to purpose of use.

6 Claims, 9 Drawing Sheets

| $\theta_1$ | $\theta_2$ | $\theta_3$ | $\theta_4$ | $\theta_5$ |
|---|---|---|---|---|
| 10° | 9.550° | 8.400° | 6.990° | 5.665° |

| $\theta_1$ | $\theta_2$ | $\theta_3$ | $\theta_4$ | $\theta_5$ |
|---|---|---|---|---|
| 5° | 4.940° | 4.778° | 4.527° | 4.217° |

| $\theta_1$ | $\theta_2$ | $\theta_3$ | $\theta_4$ | $\theta_5$ |
|---|---|---|---|---|
| 10° | 9.550° | 8.400° | 6.990° | 5.665° |

| $\theta_1$ | $\theta_2$ | $\theta_3$ | $\theta_4$ | $\theta_5$ |
|---|---|---|---|---|
| 5° | 4.940° | 4.778° | 4.527° | 4.217° |

SOLAR POWER GENERATOR FOR FORMING UNIFORM FOCAL REGION

TECHNICAL FIELD

The present disclosure relates to a solar power generator for forming a uniform focal region and, more particularly, to a solar power generator for forming a uniform focal region, the solar power generator being capable of forming the uniform focal region in a specific area with an infinite number of focuses by reflected sunlight, controlling the focal region by adjusting an angle and width according to position changes of the focal region due to optical path distortion, and controlling generated power according to purpose of use.

BACKGROUND ART

In general, power generation technologies using solar radiant energy may include technology to spread and utilize panel-type solar pads over a wide area and technology of concentrated solar power (CSP).

In a case where the panel-type solar pads are spread over the wide area to obtain energy, most exemplary embodiments passively receive incident sunlight without linking to a solar position tracking system (i.e., a type of tracking technology) reflecting solar altitude, latitude, etc.

Such CSP technology is divided into dish/Stirling engine technology, parabolic trough technology, linear Fresnel technology, and solar tower technology. Especially, the dish/Stirling engine technology and the solar location tracking system technology are combined with each other in many cases, and also the solar tower technology controls individual mirrors with feedback to ensure that the individual mirrors concentrate the maximum amount of light on a tower, thereby showing an aspect of incorporating solar position tracking as a result.

In addition, previously, there has been proposed a "Dish assembly", wherein an existing reflector for concentrating sunlight mostly uses a parabolic mirror, occasionally uses a spherical mirror (i.e., a convex mirror or concave mirror), and rarely uses a structure that has approximately one focus by disposing plane mirrors on a large plane or arranges a plurality of plane mirrors divided into pieces in a parabolic curved surface.

That is, as sunlight-concentrating reflectors and the like used in the existing CSP technology, etc. are configured to have a single focus or an approximate single focus, excessive heat than required is transferred to fluids, heat transfer media, or the like disposed at heat storage positions, resulting in a persisted root cause of CSP technology problems where losses and reduced efficiency occur.

In addition, in another related art, a "Sunlight concentration device and manufacturing method thereof" was proposed, and this related art proposed a shape of a reflector in a form of a polygonal mirror, but a cross section of the corresponding reflector is formed in the same parabolic shape as that of the existing technology.

In a yet another related art, "SOLAR RECEIVER AND ENERGY CONVERSION APPARATUS" was proposed, and this related art is characterized in that a multifocal reflector has a finite number of focuses by utilizing a plurality of parabolic mirrors.

Compared to a general parabolic mirror having a single focal distribution, this related art has a merit that sunlight may be supplied in a somewhat dispersed manner in a part where the sunlight is absorbed, but has a demerit of being unable to completely solve a problem that sufficient solar concentration efficiency required for power generation relative to the same area may not be secured because the sunlight is ununiformly concentrated in a specific area, resulting in a significant difference in supplied energy between the periphery of a finite number of focuses and non-focal regions.

In addition, the reflectors applied with the above CSP technology and the most reflectors proposed in the existing patents have demerits of being unable to actively respond to weather conditions by way of modifying widths, shapes, or the like of the reflectors.

DISCLOSURE

Technical Problem

The present disclosure was devised to solve the above problems and an objective of the present disclosure is to provide a solar power generator for forming a uniform focal region, the solar power generator applying a radius of a solar collector, performing control and design for reflected sunlight to be distributed and to form an infinite number of focal regions on a front surface of the solar collector, and preventing efficiency degradation due to uniform solar power generation and heat loss.

Another objective of the present disclosure is to provide a solar power generator for forming a uniform focal region, the solar power generator allowing sunlight to form uniform focal distributions in a plurality of cells, so as to enable uniform power generation even when a damaged cell exists among the plurality of cells.

A yet another objective of the present disclosure is to provide a solar power generator for forming a uniform focal region, the solar power generator organically adjusting a reflection angle of a reflector when focal distribution distortion occurs due to changes in the atmospheric environment, so as to enable a uniform focal distribution along an axial direction of a solar collector and enable adjusting positions of the solar collector according to distributed focuses.

A still another objective of the present disclosure is to provide a solar power generator for forming a uniform focal region, the solar power generator preventing phenomena where overcurrent and eddy current occur through the uniform focal distribution.

A still another objective of the present disclosure is to provide a solar power generator for forming a uniform focal region, the solar power generator converting generated electric energy into commercial power, so as to enable easy supply of the commercial power according to purpose of use.

Technical Solution

In the present disclosure to achieve the above-described objectives, there is provided a solar power generator for forming a uniform focal region, the solar power generator including: a reflector configured to reflect incident sunlight and direct the sunlight to a solar collector; the solar collector driven to receive the sunlight from the reflector; and a power generation controller for controlling electric power generated from the solar collector, wherein the sunlight reflected through the reflector and received on an outer peripheral surface ($y_2$) of the solar collector may satisfy [Equation 6] below:

$$y = \frac{(\alpha^2+1)(x-x_c)^2 + 2\alpha y_c(x-x_c) + y_c^2 - y_0^2}{2\{\alpha(x-x_c)+y_c+y_0\}} \quad \text{[Equation 6]}$$

The power generation controller may be characterized by controlling a power system according to the electric power of solar energy incident through the solar collector.

(In Equation 6 above, x and y indicate coordinate values according to a vertex $P_0$, and moving points $P_1$ and $P_2$, and $y_0$ indicates a vertex in a y-axis direction.)

Preferably, the reflector may be configured to form a funnel shape by combining a plurality of triangular mirror surfaces whose cross section is composed of n layers in a width direction of the reflector, and a linear focal distribution ($k_n$) of the mirror surfaces may satisfy Equation 14 below:

$$k_n = \frac{1}{2}(\cot\theta_n - \tan\theta_n)x_n + y_n \quad \text{[Equation 14]}$$

(in Equation 14 above, $k_n$ indicates an upper end value of the linear focal distribution, $x_n$ indicates the width direction of an edge of the n mirror surfaces, $y_n$ indicates a height direction of the edge of the n mirror surfaces, and $\theta_n$ indicates an incidence angle and reflection angle of each mirror surface).

Preferably, the reflector may be composed of the n layers by dividing a total length (l) of the reflector into equal parts, the funnel-shaped reflector may be configured to be folded or unfolded by adjusting an angle of each layer, and the linear focal distribution (km) of each layer corresponding to each folded part may satisfy Equation 16 below:

$$k_1 = k_2 = \ldots = k_m = \frac{l}{n}\left[\frac{1}{2}\left\{\cot\left(\sum_{k=1}^{m}\theta_k\right) - \tan\left(\sum_{k=1}^{m}\theta_k\right)\right\}\sum_{k=1}^{m}\cos\left(\sum_{s=1}^{k}\theta_s\right) + \sum_{k=1}^{m}\sin\left(\sum_{s=1}^{k}\theta_s\right)\right] \quad \text{[Equation 16]}$$

(in Equation 16 above, $k_m$ indicates an upper limit value of the focal distribution, $x_m$ indicates the width direction of the edge of the n mirror surfaces, $y_m$ indicates the height direction of the edge of the n mirror surfaces, and $\theta_k$ and $\theta_s$ respectively indicate the incidence angle and reflection angle of each mirror surface).

Preferably, the solar collector may be configured to enable position adjustment according to a focal distribution position of the reflector.

Preferably, the power generation controller may be composed of an inverter, a power management system, an energy storage system, and a controller, and controls the generated electric power in consideration of power of the inverter, solar energy density, an incidence effective area, photoelectric efficiency, and a light collection ratio.

Preferably, the power generation controller may control the generated power to be classified and supplied as power for household use, power for power plant use, and power for use of power plant connected to large power consumers.

Preferably, the power generation controller may include a machine learning system, and the machine learning system may collect measurement data by measuring the power generated by the solar collector and the power supplied, through the power generation controller, for the household use, the power plant use, and the use of power plant connected to the large power consumers, and generate training data by performing machine learning for power control suitable for purpose of use in the machine learning system on the basis of the measurement data.

Advantageous Effects

According to the solar power generator for forming a uniform focal region according to the present disclosure, there is an effect that a radius of a solar collector is applied, sunlight reflected through a reflector is distributed to form an infinite number of focal regions on an outer front surface of the solar collector, and the control and design is performed to enable uniform solar generation, thereby preventing efficiency degradation due to heat loss through uniform solar power generation.

According to the present disclosure, there is a merit that a uniform focal distribution is achieved in a plurality of cells installed in a solar collector, thereby enabling efficient solar power generation even when some of the plurality of cells are damaged.

According to the present disclosure, there is another merit that a design is made to allow a reflection angle to be adjusted organically through rotation of a reflector when focal distribution distortion occurs due to changes in the atmospheric environment, thereby enabling a uniform focal distribution in a specific area and enabling easy solar power generation through position movement of a solar collector according to distributed focuses.

According to the present disclosure, there is a yet another merit of preventing phenomena where overcurrent and eddy current occur through the uniform focal distribution in a specific area.

According to the present disclosure, there is another effect that generated electric energy may be converted into commercial power and easily supplied according to purpose of use.

According to the present disclosure, there is a yet another merit that a design is made according to power generated by a solar collector and according to allowable electric energy of a power generation controller, so as to prevent accidents due to overcurrent, high voltage, etc., whereby the power may be efficiently supplied and stored.

According to the present disclosure, there is a still another merit of enabling efficient control through various operation modes according to purpose of use and electric energy and controlling external and internal power to enable stable self-power generation through supply and inflow of power.

MODE FOR INVENTION

Hereinafter, a solar power generator for forming a uniform focal region according to the present disclosure will be described in detail along with the attached drawings.

Exemplary Embodiment 1

Figure 1A:
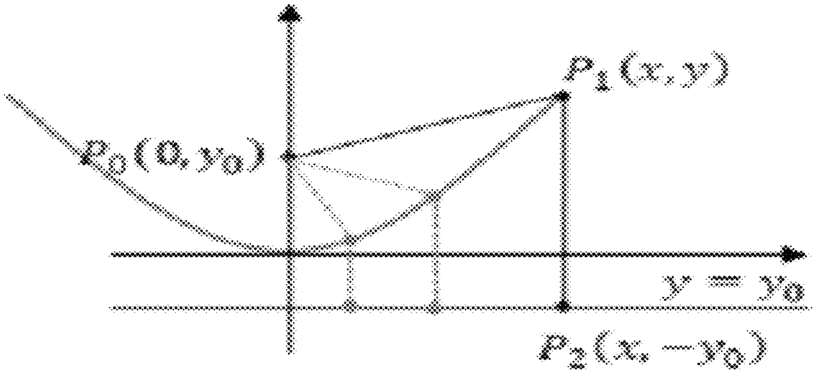
FIGS. 1A, 1B and 1C are conceptual views illustrating reflectors used in CSP technology.
Figure 1B:
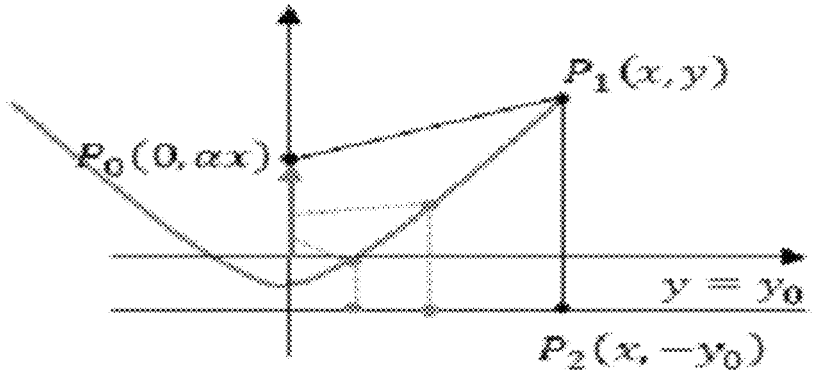
Figure 1C:
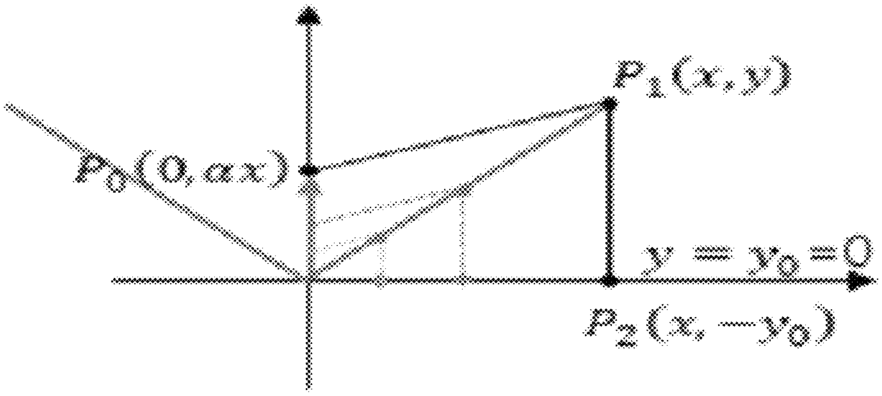
Figure 2:
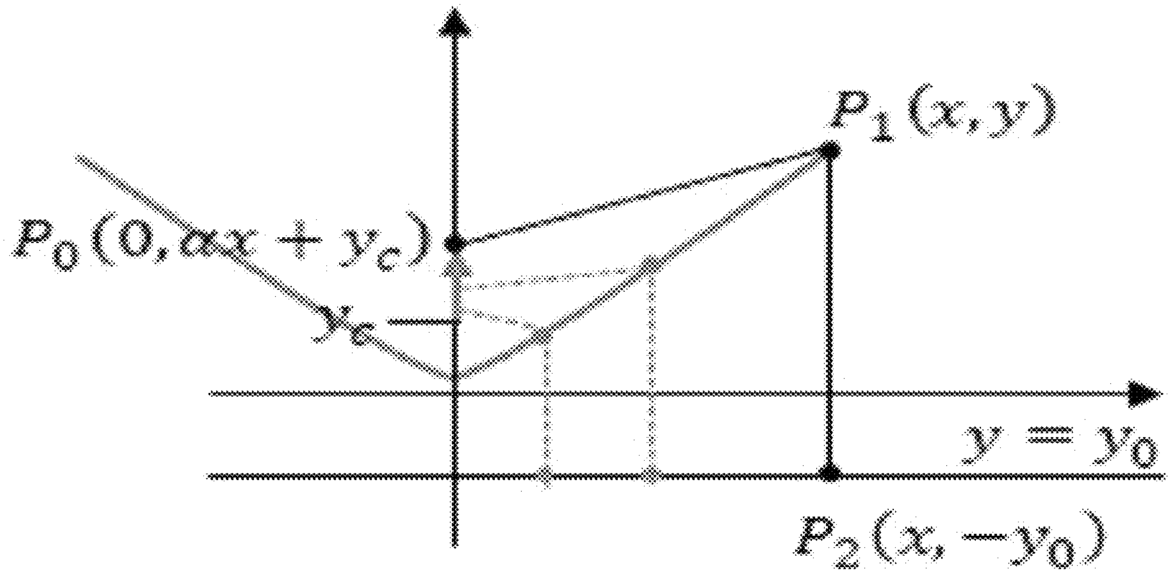
FIG. 2 is a conceptual view illustrating characteristics of a parabolic mirror from mathematical definitions.
Figure 3:
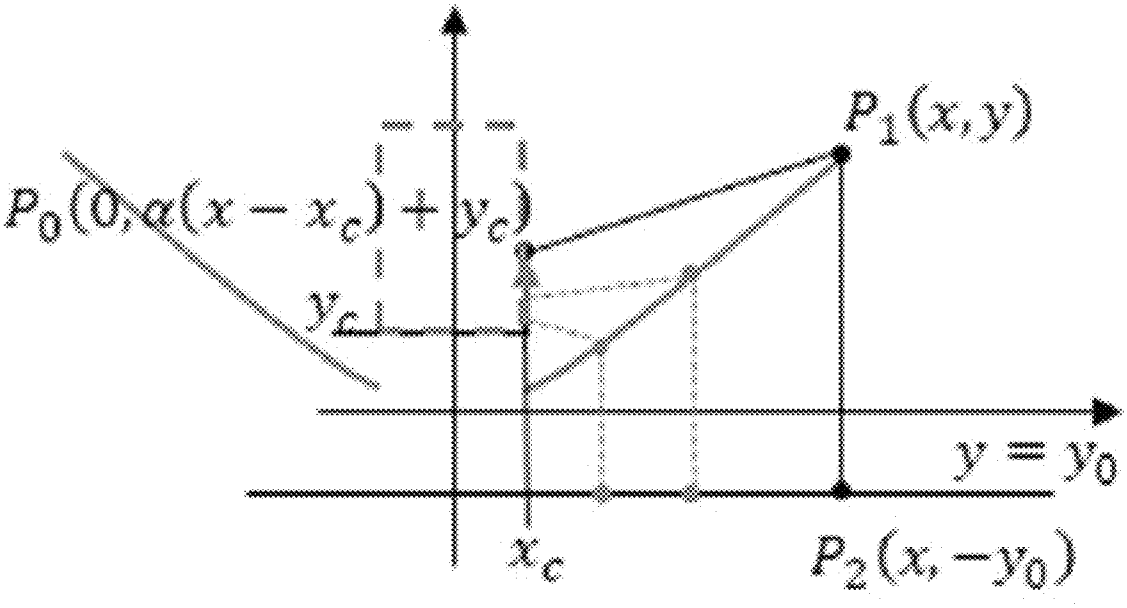
FIG. 3 is a conceptual view illustrating a focal distribution in a solar collector having a radius on the basis of a mathematical design according to the present disclosure.
Figure 4:
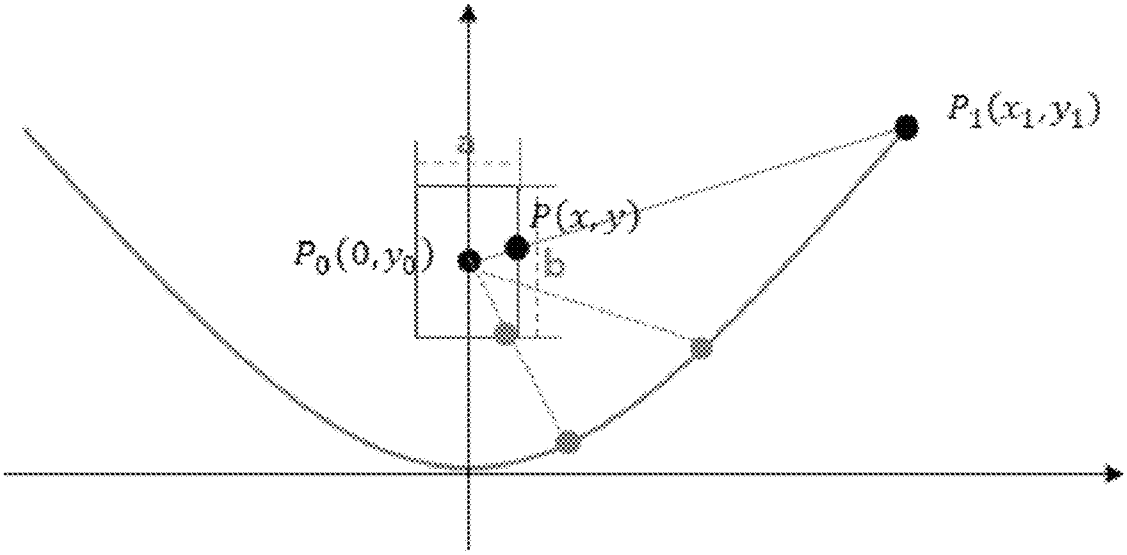
FIG. 4 is a conceptual view illustrating aligning a focus of a parabolic mirror with the center of the solar collector having the radius according to the present disclosure.
Figure 5:
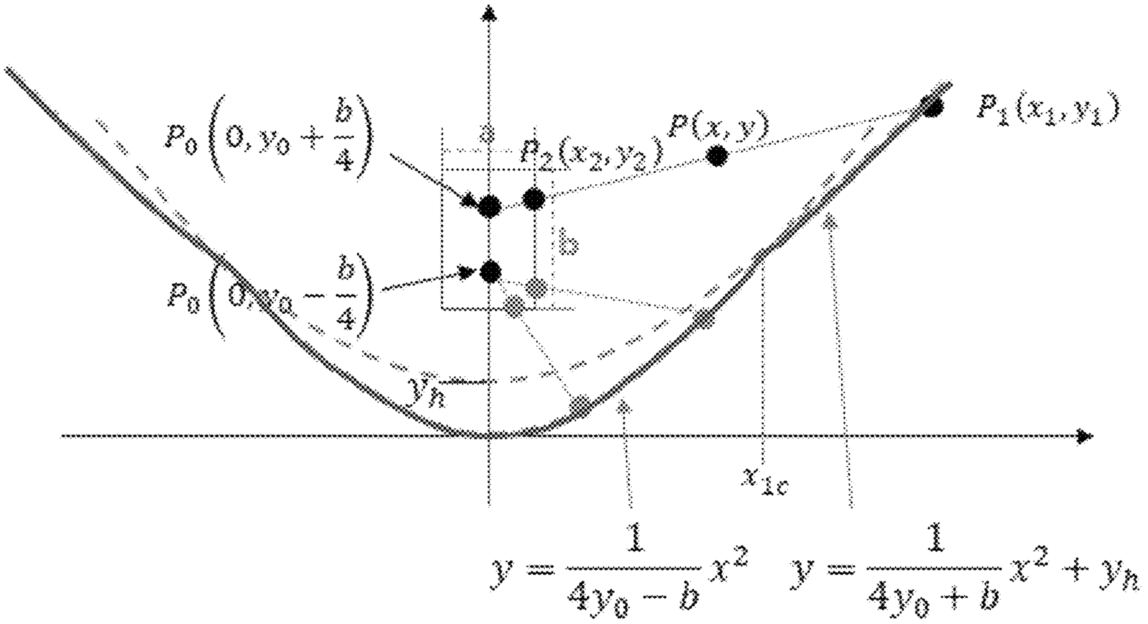
FIG. 5 is a conceptual view illustrating forming two focal distributions in the solar collector.
Figure 6A:
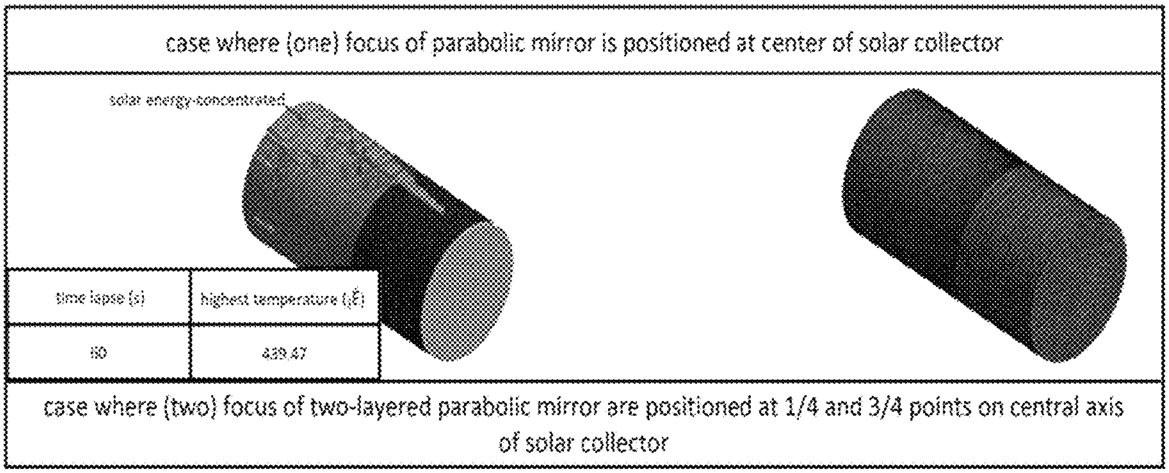
FIGS. 6A, 6B and 6C are conceptual views illustrating derived results of simulating temperature changes according to focal distributions of solar collectors according to the present disclosure.
Figure 6B:
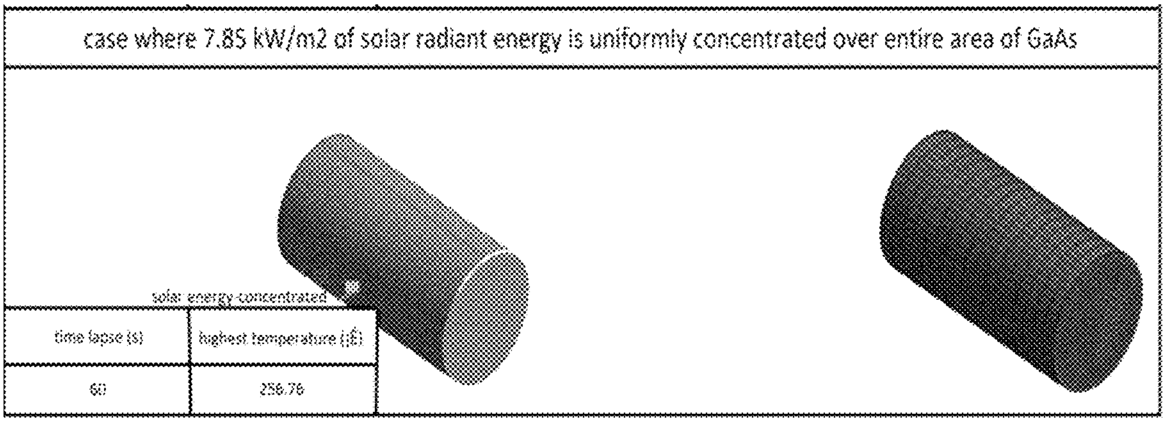
Figure 6C:
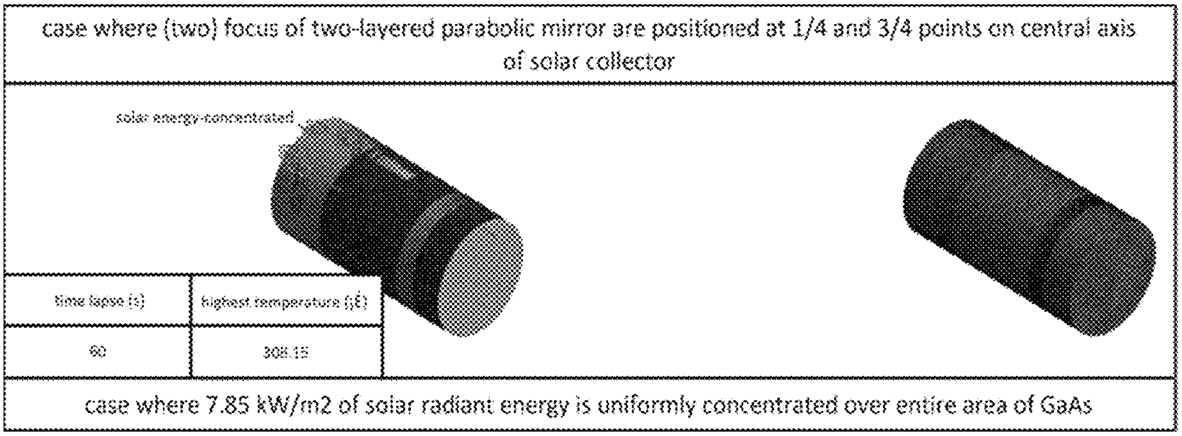

FIGS. 1A, 1B and 1C are conceptual views illustrating reflectors used in CSP technology. FIG. 2 is a conceptual view illustrating characteristics of a parabolic mirror from mathematical definitions. FIG. 3 is a conceptual view illustrating a focal distribution in a solar collector having a radius on the basis of a mathematical design according to exemplary embodiment 1 of the present disclosure. FIG. 4 is a conceptual view illustrating aligning a focus of a parabolic mirror with the center of the solar collector having the radius according to exemplary embodiment 1 of the present disclosure. FIG. 5 is a conceptual view illustrating forming two focal distributions in the solar collector. FIGS. 6A, 6B and 6C are conceptual views illustrating derived results of simulating temperature changes according to focal distributions of solar collectors according to exemplary embodiment 1 of the present disclosure.

As shown in FIGS. 1 to 6, the present disclosure relates to a solar power generator for forming a uniform focal region and, more particularly, to a solar power generator for forming a uniform focal region and, the solar power generator being capable of forming the uniform focal region in a specific area with an infinite number of focuses by reflected sunlight, controlling the focal region by adjusting an angle and width according to position changes of the focal region due to optical path distortion, and controlling generated power according to purpose of use.

To this end, the present disclosure includes: a reflector configured to reflect incident sunlight and direct the sunlight to a solar collector; the solar collector driven to receive the sunlight from the reflector; and a power generation controller for controlling power generated from the solar collector.

Here, the sunlight reflected by the reflector is allowed to be received on an outer peripheral surface y2 of the solar collector.

In addition, the power generation controller controls a power system according to electric power of solar energy incident through the solar collector.

Prior to this, reflectors are formed in various shapes such as a parabolic mirror, a spherical mirror (i.e., a convex mirror or concave mirror), and a plane mirror, so as to reflect concentrated sunlight toward the solar collector.

Among these reflectors, as shown in FIG. 1A, the parabolic mirror has a cross section formed in a parabolic shape and improves solar concentration efficiency by reflecting concentrated sunlight at a single focal point.

This is derived by applying modifications from the existing mathematical definition of a parabola based on mathematical principles.

That is, as shown in FIG. 1A, the definition of the parabola is expanded under a condition that a distance between a vertex $P_0(0, y_0)$ and an arbitrary moving point $P_1(x, y)$ and a distance between the moving point $P_1$ and a moving point $P_2(x, -y_0)$ are the same, and in this case, a condition of $\overline{P_0P_1}=\overline{P_1P_2}$ is derived through a condition of $y=y_0$.

In this case, Equation 1 is derived from the above-derived detail.

$$y = \frac{1}{4y_0}x^2 \quad \text{[Equation 1]}$$

The equation derived as above is used in the design of existing parabolic mirrors, and is applied to various devices for light concentration and heat collection.

From such mathematical principles, when a focus changes proportionally in a height direction depending on a separated distance of a reflected position of sunlight within a reflector from a center position, a focal distribution is determined according to an established definition.

Accordingly, by conceiving an idea that a reflector having a focal distribution may be obtainable, a parabolic mirror was designed by using mathematical equations.

In this way, when a focus varies on a y-axis depending on a position of a cross section of a reflector, coordinates of the focus may be expressed as $P_0(0, \alpha x)$ by modifying and applying the principle of Equation 1 above.

In this case, expressing the coordinates of the focus as $P_0(0, \alpha x)$ means that when x is 0, coordinates of the focus become $P_0(0, 0)$, and when x is 1, coordinates of the focus become $P_0(0, \alpha x)$.

Here, $\alpha$ is a focal distribution distributed in a solar collector. When a small value is assigned thereto, the focal distribution is formed to be dense over a relatively narrow area on a y-axis, and when a large value is assigned thereto, the focal distribution is formed to be sparse over a relatively large area on the y-axis.

Under such conditions, when a condition $\overline{P_0P_1}=\overline{P_1P_2}$ is used as above, an equation of a vertical cross section of a reflector may be derived as shown in Equation 2, and a schematic shape thereof is the same as shown in an example of FIG. 1B.

In addition, FIG. 1B shows an example obtained by applying Equation 2, and shows a vertical cross-sectional shape of the reflector obtained by substituting $\alpha=1$ and $y_0=1$.

$$y = \frac{1}{2\alpha}\left(\alpha + \frac{1}{\alpha}\right)(\alpha x - y_0) + \frac{y_0^2}{2\alpha^2}\frac{1}{\alpha x + y_0} \quad \text{[Equation 2]}$$

In this case, in Equation 2, x and y are coordinate values of a moving point $P_1$ according to moving points $P_0$, $P_1$, and $P_2$, and $y_0$ indicates a vertex in a y-axis direction. Accordingly, the reflector of the present disclosure is designed so that a radial length y has a value satisfying Equation 2 above, whereby designing a reflector having a parabolic mirror is achievable. However, focuses are distributed at a specific place, and temperature at the specific place rises due to the distributed focus place.

That is, referring to FIG. 1B, it may be confirmed that a vertical cross section of the parabolic mirror derived through Equation 2 above is not a straight line, but the larger an x value is, the larger a reflector is, and the farther a point is from the center of the reflector, the closer the point is to a straight line.

This is because a second term of Equation 2 contains an inversely proportional function to x, and as x increases, the term of the inversely proportional function becomes smaller, resulting in linearization.

Here, a structure of the reflector changes depending $\alpha$ and $y_0$. The smaller $\alpha$ is, the shorter a line segment relative to a focus is, converging to a single point, so the reflector has a shape converging to a parabolic mirror. The larger $\alpha$ is, the longer the line segment relative to the focus is, making the reflector a straight mirror, i.e., a plane mirror, so the reflector is formed in an intermediate shape between the parabolic mirror and the plane mirror by making $\alpha$ to have a suitable value.

Assuming that there is a linear absorber in the center part of the reflector designed on the basis of Equation 2 above, reflected light with focuses of a linear distribution is almost uniformly absorbed in a solar collector, whereby light collection efficiency may be greatly improved.

In addition, when there is a condition of $y_0=0$, the second term in Equation 2 is canceled, so Equation 3 is derived. At this time, a vertical cross section of a reflector is derived as a funnel shape having a straight line form.

$$y = \frac{1}{2}\left(\alpha + \frac{1}{\alpha}\right)x \qquad \text{[Equation 3]}$$

The vertical cross-sectional shape according to Equation 3 has the same cross section as shown in FIG. 1C, and takes the shape of a cone when the vertical cross section is rotated.

In such a reflector, each side of a polygonal pyramid reflector is a flat surface, and thus the cost may be reduced by combining pieces of plane mirrors to produce a reflector in a polygonal pyramid shape.

Accordingly, when the solar collector is separated by a predetermined distance $y_c$ away from the center of the reflector, it is preferable to set a reflector focal distribution to be distributed from a height $y_c$ on the y-axis to $\alpha x+y_c$ at an end part of the solar collector.

That is, $y_c$ is a starting point of the solar collector and indicates a distance the solar collector is separated in the y-axis direction from the origin of coordinates, as shown in FIG. 3.

In order to design a reflector satisfying such conditions, when $P_{0(0,\alpha x+y_c)}$ is taken as coordinates of a focus and a condition $\overline{P_0P_1}=\overline{P_1P_2}$ is used, Equation 4 is derived.

$$y = \frac{(\alpha^2+1)x^2 + 2\alpha y_c x + y_c^2 - y_0^2}{2(\alpha x + y_c + y_0)} \qquad \text{[Equation 4]}$$

A vertical cross section of a reflector according to Equation 4 has a cross-sectional shape as shown in FIG. 2.

Accordingly, the reflector has the vertical cross-sectional shape satisfying Equation 4, but as the shape is complex and required to be organized through constraints, when $y_0=0$, the vertical cross-sectional shape in FIG. 4 is derived as the vertical cross-sectional shape as shown in FIG. 1B.

That is, since Equation 4 may be reduced to Equation 2, when a situation of $y_c \neq y_0$, $y_0=0$ is assumed, Equation 4 is organized as Equation 5.

$$y = \frac{1}{2}\left(\alpha + \frac{1}{\alpha?}\right)x + \frac{1}{2}\left(1 - \frac{1}{\alpha^2}\right)y_c + \frac{y_c^2}{2\alpha^2}\frac{1}{\alpha x + y_c} \qquad \text{[Equation 5]}$$

Equation 5 above is also similar to Equation 2 in that a first term has a linear function, a second term has a constant term, and a third term has an inversely proportional function term, and is close to the shape of a straight line overall, but is actually in the shape of a curve.

That is, through deriving Equation 4 and Equation 5, reflected light may be distributed completely linearly and uniformly on the y-axis of the solar collector away from the reflector, and through Equation 3, a reflector for distributing focuses linearly and uniformly on the y-axis may be designed by using a plane mirror.

Here, in a case where a shape of the solar collector is not linear but a shape having a radius or half width $x_c$, sunlight reflected from a reflector is distributed at each point different from result values according to Equations 2 to 5.

Accordingly, in a case where the solar collector is formed with the radius or half width thereof, designing is made for a form in which a focal distribution of the reflector moves in parallel by a radius $x_c$ of the solar collector as shown in FIG. 3.

That is, $x_c$ is a width of the solar collector, and indicates a distance spaced from the origin of coordinates in the x-axis direction according to the width of the solar collector as shown in FIG. 3.

When the cross-sectional shape of the reflector moves in parallel by $x_c$, the focal distribution of the reflector also moves in parallel by $x_c$.

That is, a point x in the reflector is moved to $x+x_c$ as the point moves by $x_c$, which is the radius of the solar collector.

Accordingly, by substituting $x-x_c$ into x in Equation 4, Equation 6 that satisfies FIG. 3 is derived.

$$y = \frac{(\alpha^2+1)(x-x_c)^2 + 2\alpha y_c(x-x_c) + y_c^2 - y_0^2}{2\{\alpha(x-x_c) + y_c + y_0\}} \qquad \text{[Equation 6]}$$

Since the radius of the solar collector is applied to Equation 6, sunlight reflected through the reflector is uniformly distributed on the outer surface of the solar collector having a volume and capacity thereof.

In this way, by applying not a linear shape but a radius shape realized with a width and height to the solar collector, focuses of sunlight reflected from the reflector are uniformly distributed on the outer surface of the solar collector.

Accordingly, as shown in FIG. 4, the solar collector may perform light collection distribution according to a position of $P_2$ in a state where a focus of the parabolic mirror is aligned with the center of width a and height b.

FIG. 4 shows a horizontal cross section of the reflector, and when an equation of a straight line of a line segment $\overline{P_0P_1}$ on the conceptual view is defined as $y=\beta x+y_0$ and a point where the parabolic mirror and the straight line meet is defined as $P_1(x_1, y_1)$, $\beta$ may be obtained by using conditions $$y_1=\beta x_1+y_0 \text{ and } y_1=\frac{1}{4y_0}x^2.$$

Here, when the equation of the straight line of the line segment $\overline{P_0P_1}$ is obtained by determining β, Equation 7 is derived as follows.

$$y=\left(\frac{1}{4y_0}x_i-\frac{y_0}{x_1}\right)x+y_0 \quad \text{[Equation 7]}$$

In addition, since the conditions $$y_2=\left(\frac{1}{4y_0}x_1-\frac{y_0}{x_1}\right)x_2+y_0$$

and conditions $$y_2=y_0-\frac{b}{2}$$

are satisfied at an intersection point $P_2(x_2, y_2)$ where the bottom of the solar collector and the line segment $\overline{P_0P_1}$ meet, an x-component position $x_2$ of the bottom part of the solar collector is derived as shown in Equation 8.

$$x_2=\frac{2by_0x_1}{4y_0^2-x_1^2} \quad \text{[Equation 8]}$$

Through Equation 8, it may be confirmed that sunlight incident on an x-component position $x_1$ of the reflector is reflected and reaches an x-component position $x_2$ at the bottom of the solar collector.

In addition, since the conditions $$y_2=\left(\frac{1}{4y_0}x_1-\frac{y_0}{x_1}\right)x_2+y_0$$

and conditions $$x_2=\frac{a}{2}$$

are satisfied at an intersection point $P_2(x_2, y_2)$ where a side surface of the solar collector and a line segment $\overline{P_0P_1}$ meet, a y component position $y_2$ on the side surface of the solar collector is derived as shown in Equation 9.

$$y_2=\frac{a}{2}\left(\frac{1}{4y_0}x_1-\frac{y_0}{x_1}\right)+y_0 \quad \text{[Equation 9]}$$

Through Equation 9, it may be confirmed that the sunlight incident on an x-component position $x_1$ of the reflector is reflected and reaches a y-component position $y_2$ on the side surface of the solar collector.

In this way, Equation 9 may derive exact positions where sunlight reflected from the reflector may be distributed on the outer surface of the solar collector having the radius thereof.

In addition, it may be confirmed that through Equations 8 and 9, the x-component and y-component are derived according to $P_2(x_2, y_2)$ of the solar collector having the radius thereof.

Accordingly, the present disclosure derives $P_2(x_2, y_2)$ of the reflector through the principles of Equations 8 and 9, so that reflected sunlight makes an infinite number of focuses uniformly distributed accordingly on the outer surface of the solar collector having the volume thereof, thereby forming a focal region.

In this way, the reflector enables forming the focal distribution uniformly over the entire outer surface of the solar collector, rather than forming a specific focus.

In addition, in Equations 1 to 5, as the solar collector is disposed on a linear line, focuses of light reflected through the reflector are formed along a y-axis linear line.

However, in a typical solar collector, as cells are installed on an outer surface of a frame thereof, the solar collector has a volume or capacity according to a radius or half width thereof.

Accordingly, in a case where focuses are formed along the y-axis line, there occurs a problem that accurate focuses are not formed due to a difference between these focuses and focuses formed on the outer surface of the solar collector having the volume thereof.

Accordingly, Equation 6 reflects the volume and capacity of the solar collector, so that sunlight reflected through the reflector forms accurate focuses on the outer surface of the solar collector, and at the same time, an infinite number of focuses may be distributed uniformly on a specific area on the outer surface of the solar collector.

Comparative Example

A comparative example is designed such that focuses of sunlight reflected from the reflector are formed as two or more finite number of focuses, whereby in the solar collector, a focal region is formed according to the two or more finite number of formed focuses.

Accordingly, FIG. 5 shows a vertical cross-sectional shape of a two-layered parabolic mirror structure, and a multilayered parabolic mirror structure is designed so that a focus varies depending on an x-component radius relative to a specific point $x_{1c}$, etc.

Here, $y_h$ shown in FIG. 5 indicates a height of an y component of a parabolic mirror, and $x_{1c}$ indicates a point of contact of a layer of the multilayered parabolic mirror.

In this case, a schematic view shows a two-layered parabolic mirror where a cross section curve $$y_1=\frac{1}{4y_0-b}x_1^2$$

is based on $x_{1c}$ to have a focus $$y_0-\frac{b}{4}$$

when $x_1 \le x_{1c}$, and a cross section curve $$y_1=\frac{1}{4y_0+b}x_1^2+y_h$$

is based on $x_{1c}$ to have a focus $$y_0 + \frac{b}{4}$$

when $x_{1C} \prec x_1$

Prior to this, in $y_h$, $x_{1c}$ is substituted into two conditions $$y_1 = \frac{1}{4y_0 + b}x_1^2 + y_h \text{ and } y_1 = \frac{1}{4y_0 - b}x_1^2$$

whose $y_1$ values are the same, $$\frac{1}{4y_0 - b}x_1^2 = \frac{1}{4y_0 + b}x_1^2 + y_h$$

is established, so $y_h$ is derived as $$y_h = \frac{1}{2\left(y_0 - \frac{b}{4}\right)\left(y_0 + \frac{b}{4}\right)}x_{1C}^2.$$

Here, by using the condition $$y_1 = \frac{1}{4y_0 + b}x_1^2 + y_h$$

and condition $$y_1 = \frac{1}{4y_0 - b}x_1^2,$$

an x-component position $x_2$ of the bottom of the solar collector and a y-component position $y_2$ of the side surface of the solar collector were derived through the derivation method described above.

In addition, since the conditions $$y_2 = \left(\frac{x_1}{4\left(y_0 - \frac{b}{4}\right)} - \frac{y_0 - \frac{b}{4}}{x_1}\right)x_2 + y_0 - \frac{b}{4} \text{ and } y_2 = y_0 - \frac{b}{2}$$

are satisfied at an intersection point $P_2(x_2, y_2)$ where the bottom of the solar collector and a component $\overline{P_0P_1}$ meet, an x-component position $x_2$ at the bottom of the solar collector may be derived from Equation 10 above.

[Equation 10]

$$x_2 = \frac{2b\left(y_0 - \frac{1}{4}b\right)x_1}{4\left(y_0 - \frac{1}{4}b\right)^2 - x_1^2}$$

Accordingly, in Equation 10, an x-component position $x_2$ at the bottom of the solar collector is derived from an intersection point $P_2(x_2, y_2)$ where a bottom line segment $\overline{P_0P_1}$ meets.

[Equation 11]

$$y_2 = \frac{a}{2}\left(\frac{x_1}{4\left(y_0 - \frac{b}{4}\right)} - \frac{y_0 - \frac{b}{4}}{x_1}\right) + y_0 - \frac{b}{4}$$

Equation 11 satisfies conditions $$y_2 = \left(\frac{x_1}{4\left(y_0 - \frac{b}{4}\right)} - \frac{y_0 - \frac{b}{4}}{x_1}\right)x_2 + y_0 - \frac{b}{4} \text{ and } x_2 = \frac{a}{2}$$

at an intersection point $P_2(x_2, y_2)$ where the side surface of the solar collector and a line segment $\overline{P_0P_1}$ meet when $x_1 \le x_{1c}$, so a y component position $y_2$ is derived.

[Equation 12]

$$y_2 = \frac{a}{2}\left(\frac{x_1}{4\left(y_0 + \frac{b}{4}\right)} - \frac{y_0 + \frac{b}{4} - y_h}{x_1}\right) + y_0 + \frac{b}{4}$$

Equation 12 satisfies conditions $$y_2 = \left(\frac{x_1}{4\left(y_0 + \frac{b}{4}\right)} - \frac{y_0 + \frac{b}{4} - y_h}{x_1}\right)x_2 + y_0 + \frac{b}{4} \text{ and } x_2 = \frac{a}{2}$$

at an intersection point $P_2(x_2, y_2)$ where the side surface of the solar collector and a line segment $\overline{P_0P_1}$ meet when $x_{1C} \prec x_1$, so an y component position $y_2$ is derived.

In this way, by using the results derived from Equations 10 to 12, the two-layered parabolic mirror in which two focal regions are formed may be confirmed.

Next, a simulation was performed to compare temperature distributions after a predetermined period of time by calculating the solar energy density through the mathematical equations according to the present disclosure.

Here, an area of the solar collector is divided into 49 sections, an average density of solar radiant energy was calculated as 7.85 $kW/m^2$ (35.67 times a density of 220 $W/m^2$, i.e., a light collection ratio of 35.67), and depending on the form of solar light distribution in the area of the solar collector, temperatures were compared with each other after about 60 seconds.

In addition, each cell of the solar collector was shaped like a circular pipe with 1 mm thick GaAs positioned in a middle part, and 1 mm thick disks made of aluminum were formed on opposite sides of the GaAs form as a guard.

FIG. 6A reflects that the solar energy density is formed in a single focal region in the solar collector on the basis of equations 8 and 9.

FIG. 6B reflects that the solar energy density is formed in two focal regions in the solar collector on the basis of equations 10 to 12.

FIG. 6C reflects that the solar energy density is formed uniformly over the entire outer surface of the solar collector on the basis of Equation 6.

Accordingly, referring to temperature distributions of the solar collector,

- it may be confirmed that the highest temperature in the single distribution area of the solar collector in FIG. 6A rises to 439.47° C.

It may be confirmed that the highest temperature in the two distribution areas of the solar collector in FIG. 6B rises to 308.15° C.

It may be confirmed that the highest temperature was measured in a central part of the entire area of the solar collector in FIG. 6*c*, and the highest temperature rises to 256.76° C.

Accordingly, the power generator using the reflector proposed in the present disclosure has an effect of increasing a temperature by 41.6% less for 60 seconds than the light-concentrating solar power generator using the single parabolic mirror. In addition, it may be confirmed that the power generator using the reflector proposed in the present disclosure has an effect of increasing a temperature by 16.7% less for 60 seconds than the light-concentrating solar power generator using the two-layered parabolic mirror.

In this way, in a case where sunlight reflected through the reflector forms a finite number of focal regions on the solar collector, it may confirm a problem of temperature increase compared to that of uniformly forming an infinite number of focal regions on the outer surface of the solar collector.

Accordingly, in a case where the finite number of focal regions are formed at a specific place, it may be confirmed that there occur a problem that cell temperature rises at the place where solar energy density is excessively concentrated and cells positioned in the focal region are excessively used for solar power generation among a plurality of cells.

In this way, it may be determined that cells are damaged or broken as temperature rises in a measuring part of each cell and inefficient power generation occurs due to focuses concentrated on cells in a specific area.

Accordingly, the infinite number of focal regions may be uniformly formed on the outer surface of the solar collector through the reflector derived from Equation 6, so that the plurality cells may increase efficiency through uniform power generation.

In this way, through the uniform power generation by the plurality of cells, service life and solar power generation efficiency may be improved and damage, breakage, etc. may be prevented.

Exemplary Embodiment 2

Figure 7A:
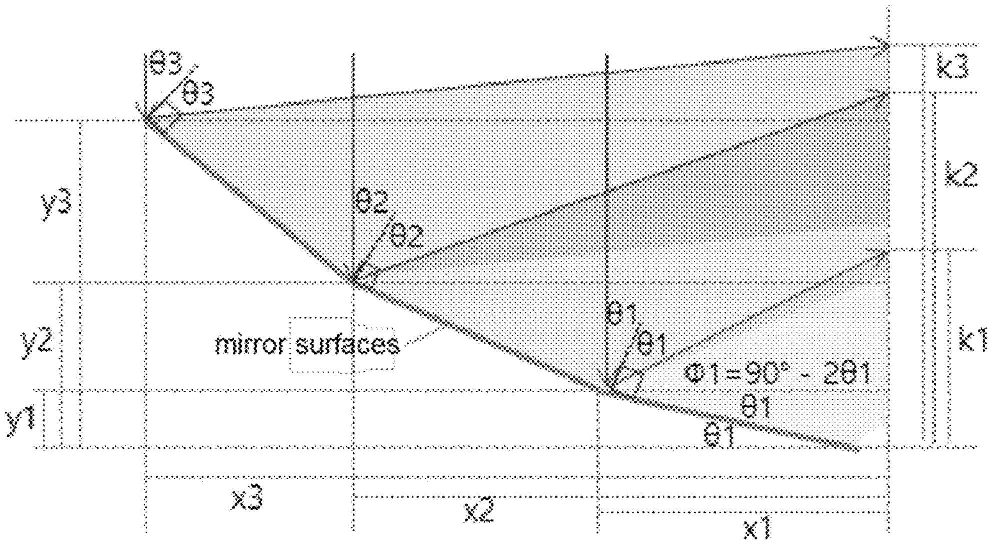
FIGS. 7A and 7B are conceptual views illustrating a reflector to which a design of a multilayer plane mirror is applied on the basis of a mathematical design according to the present disclosure.
Figure 7B:
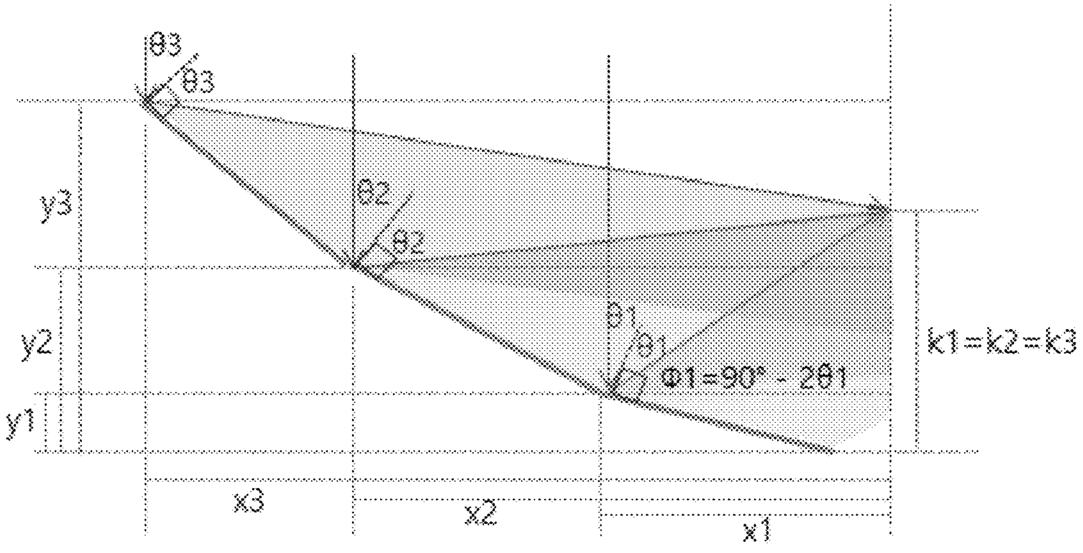
Figure 8:
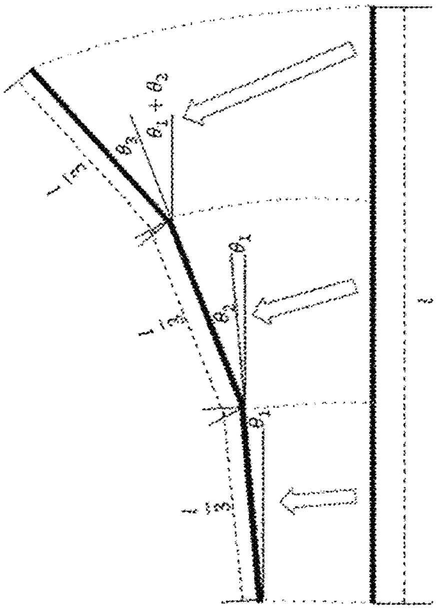
FIG. 8 is a conceptual view illustrating a multilayer reflector capable of foldable adjustment based on a mathematical design according to the present disclosure.
Figure 8:
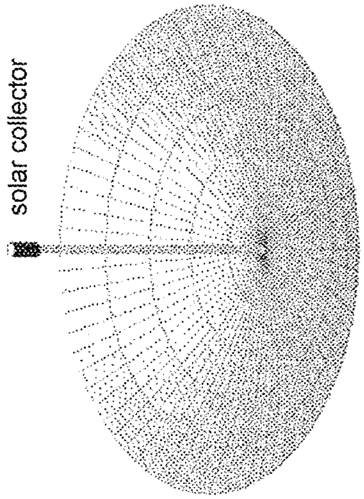
Figure 8:
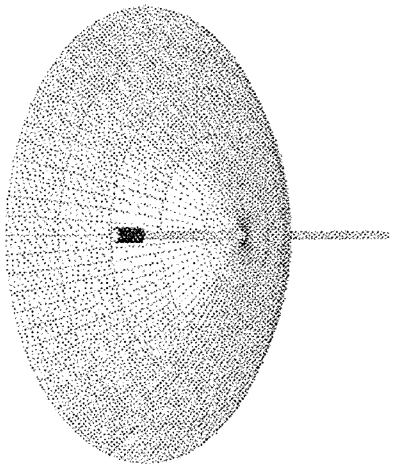

FIGS. 7A and 7B are a conceptual view illustrating a reflector to which a design of a multilayer plane mirror is applied on the basis of a mathematical design according to exemplary embodiment 2 of the present disclosure, and FIG. 8 is a conceptual view illustrating a multilayer reflector capable of foldable adjustment based on a mathematical design according to exemplary embodiment 2 of the present disclosure.

As shown in FIGS. 7A, 7B and 8, the second exemplary embodiment includes the first exemplary embodiment, but a reflector is made of n layers that satisfy [Equation 14].

Accordingly, the reflector is configured to form a funnel shape by combining a plurality of triangular mirror surfaces whose cross section is composed of the n layers in a width direction of the reflector, and a linear focal distribution $k_n$ of the mirror surfaces satisfies Equation 14 below.

Accordingly, as shown in FIG. 7A, the reflector has a funnel shape formed with the n layers by plane mirror surfaces, and may improve the light collection ratio by using a method of matching focuses toward a solar collector as shown in FIG. 7B.

That is, each view shows a cross section of one side of the multilayer plane mirrors, and when sunlight enters, the sunlight is reflected on each mirror surface and is uniformly distributed to a certain area of a solar collector.

Accordingly, when positions at a time when sunlight reflected from an end of a mirror on each layer reaches to a y-axis are defined (where n: a layer number, n=1, 2, 3, . . . ), a focal distribution is generally derived as Equation 13 through the expansion similar to that of Equation 16.

$$k_n = x_n\tan\phi_n + y_m = x_n\tan(90^\circ - 2\theta_n) + y_m = x_n\cot(2\theta_n) + y_m = \frac{1}{2}(\cot\theta_n - \tan\theta_n)x_n + y_m \quad \text{[Equation 13]}$$

Here, in a case where an upper end of a linear focal distribution of each mirror is $k_n(k_1, k_2, k_3, \ldots)$, an incidence angle and reflection angle of each mirror surface is $\theta_n(\theta_1, \theta_2, \theta_3, \ldots)$ when an edge of each mirror surface is defined as $x_1, x_2, \ldots, x_n$ in a width direction and an edge of each mirror surface is defined as $y_1, y_2, \ldots, y_n$ in a height direction.

$$k_n = \frac{1}{2}(\cot\theta_n - \tan\theta_n)x_n + y_n \quad \text{[Equation 14]}$$

Through Equation 14, sunlight may be distributed on the y-axis through each mirror surface of the n layers of the reflector.

In addition, as shown in FIG. 7B, when matching all the focal distribution upper limits of respective layer mirrors (i.e., $k_1=k_2=\ldots=k_m=\ldots=k_n$), Equation 15 is established.

$$\frac{1}{2}(\cot\theta_n - \tan\theta_n)x_n + y_n = \frac{1}{2}(\cot\theta_m - \tan\theta_m)x_m + y_m \quad \text{[Equation 15]}$$

Equation 15 allows focuses of sunlight reflected from the mirror surfaces of respective layers to match at a specific area on the y-axis according to a position of the solar collector, thereby deriving a high light collection ratio.

In addition, when the mirror surfaces are overlapped and combined with each other, spacings between the mirror surfaces may be adjusted, and in this way, a shape of the reflector may be changed depending on incidence light and surrounding conditions.

However, the spacings between the mirror surfaces should be adjusted only within a range that satisfies values of Equation 14 above.

In this way, a reflector is formed with a funnel shape produced by plane mirrors of n layers along a width direction, so the reflector may be easily manufactured at a low cost.

In addition, when the above structure to which the reflector design method is used is applied, a uniform energy density distribution may be achieved, thereby enabling uniform power generation through cells.

Next, the reflector is configured with n layers by dividing the total length l of the reflector into equal parts and is configured to adjust an angle of each layer so that the funnel-shaped reflector folds or unfolds. The linear focal distribution $k_m$ of each layer corresponding to each folded part satisfies Equation 16 below.

Accordingly, the reflector is formed as the funnel shape through the plane mirrors of the n layers derived from Equations 14 and 15. The reflector is configured to be divided into equal intervals along a circumference thereof and to be unfolded or folded by a power source such as a cylinder motor.

In this way, the reflector adjusts the positions of the linearly distributed focuses on the y-axis by angles unfolded or folded.

To this end, not only an x-coordinate $x_m$ and y-coordinate $y_m$ of an end part of each layer mirror and corresponding to each folded part but also an upper limit $k_m$ of each focal distribution may be expressed as Equation 16.

Here, as shown in FIGS. 7A and 7B, $x_m$ is an interval from the origin of coordinates to a point along the x-axis direction according to an end point of an m-th mirror surface of n layers, $y_m$ is an interval from the origin of coordinates to a point along the y-axis direction according to the end point of the m-th mirror surface of the n layers.

Accordingly, as an example, as shown in FIGS. 7A and 7B, $x_m$ is expressed as $x_1$ which is an end point in the x-axis direction of a first mirror surface in a case of a first layer, and is expressed as $x_2$ which is an end point in the x-axis direction of a second mirror surface in a case of a second layer.

In addition, $y_m$ is expressed as $y_1$ which is the end point in the y-axis direction of the first mirror surface in the case of the first layer, and is expressed as $y_2$ which is the end point in the y-axis direction of the second mirror surface in the case of the second layer.

That is, $x_m$ and $y_m$ respectively indicate the end points in the x-axis direction and y-axis direction of the m-th mirror surface according to the origin and the n layers along the x-axis and the y-axis.

[Equation 16]

$$k_1 = k_2 = \ldots = k_m = \frac{l}{n}\left[\frac{1}{2}\left\{\cot\left(\sum_{k=1}^{m}\theta_k\right) - \tan\left(\sum_{k=1}^{m}\theta_k\right)\right\}\sum_{k=1}^{m}\cos\left(\sum_{s=1}^{k}\theta_s\right) + \sum_{k=1}^{m}\sin\left(\sum_{s=1}^{k}\theta_s\right)\right]$$

Here, conditions of $x_m$ and $y_m$ are defined as:

$$x_m = \frac{l}{n}\sum_{k=1}^{m}\cos\left(\sum_{s=1}^{k}\theta_s\right),\ y_m = \frac{l}{n}\sum_{k=1}^{m}\sin\left(\sum_{s=1}^{k}\theta_s\right)$$

which are respectively expressed as above.

Accordingly, components of a guard, a reinforcement plate, etc. are installed at a rear side of the reflector and a power means such as a motor or a cylinder is provided at a boundary part where the reflector layers are interlocked and folded with each other, so as to adjust the angles by folding or unfolding the reflector under a condition of satisfying Equation 16 depending on changes in upper limits $k_m$ of the focal distribution.

In addition, when an initial position of the reflector is moved, a position of the solar collector is moved in a vertical direction, so as to determine a position that satisfies a focal distribution of solar energy according to Equation 16, whereby the maximum solar energy is received.

In addition, considering various environments such as the altitudes and locations of the sun, climate change, surrounding atmospheric conditions, and cloud conditions, the reflector tracks instantaneous changes in collected solar energy, so that within a range satisfying Equation 16, the reflector is folded or the focal distribution of solar energy is controlled.

In this case, the solar collector moves a position thereof in the y-axis direction according to focuses distributed through the reflector to receive solar energy.

Figure 9:
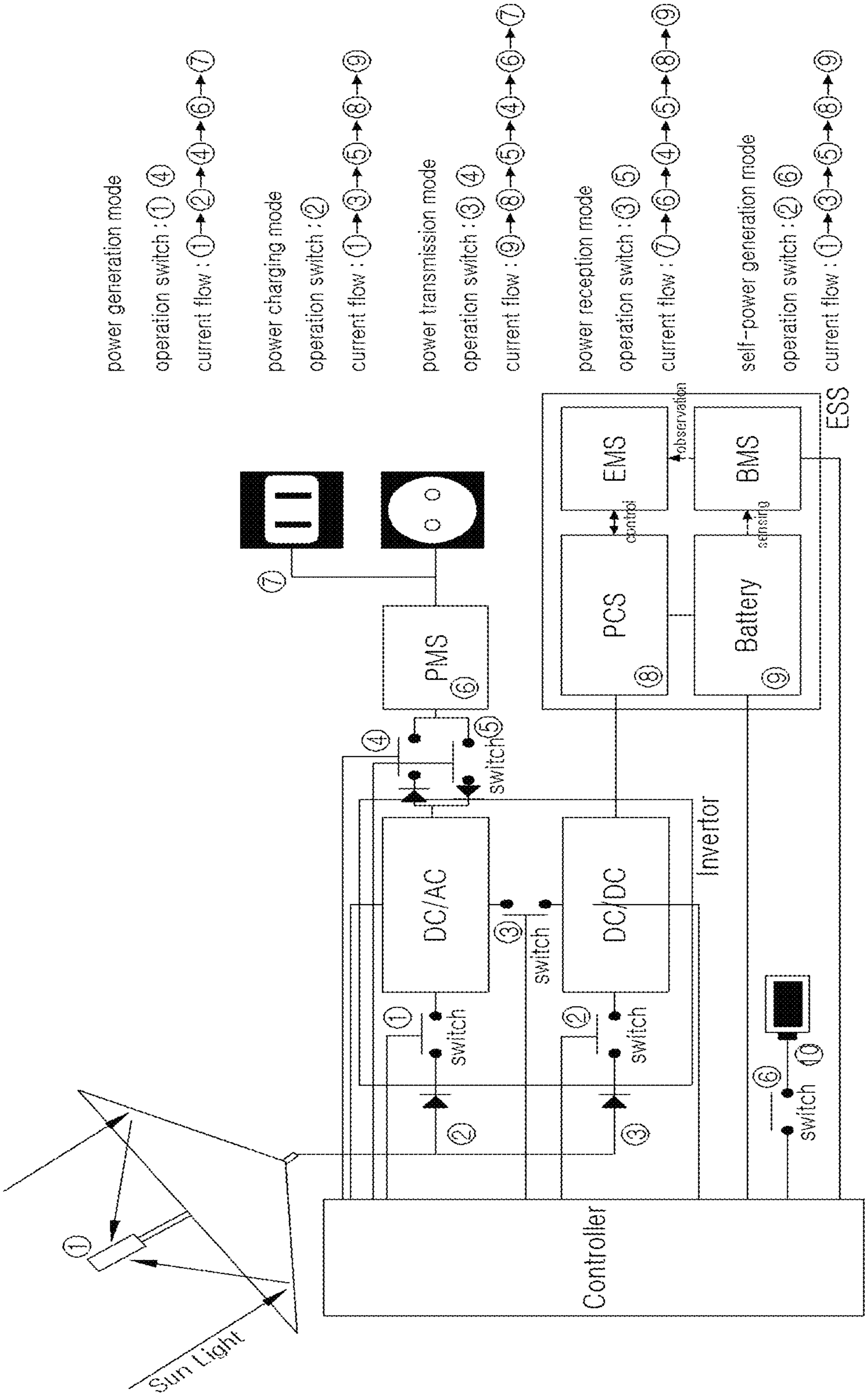
FIG. 9 is a conceptual view illustrating a power controller configured to supply commercial power for household use according to the present disclosure.
Figure 10:
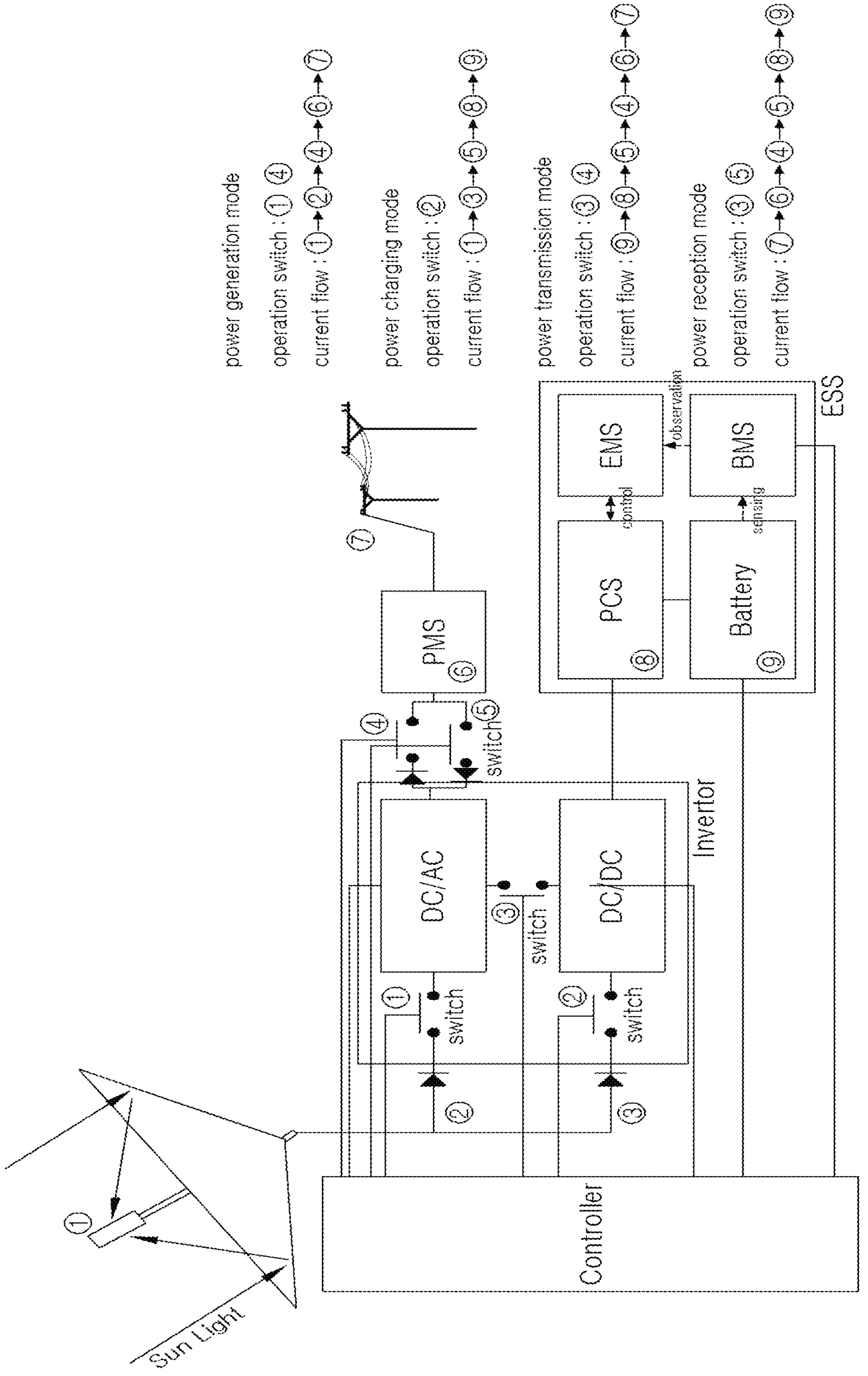
FIG. 10 is a conceptual view illustrating a power controller configured to supply commercial power for power plant use according to the present disclosure.
Figure 11:
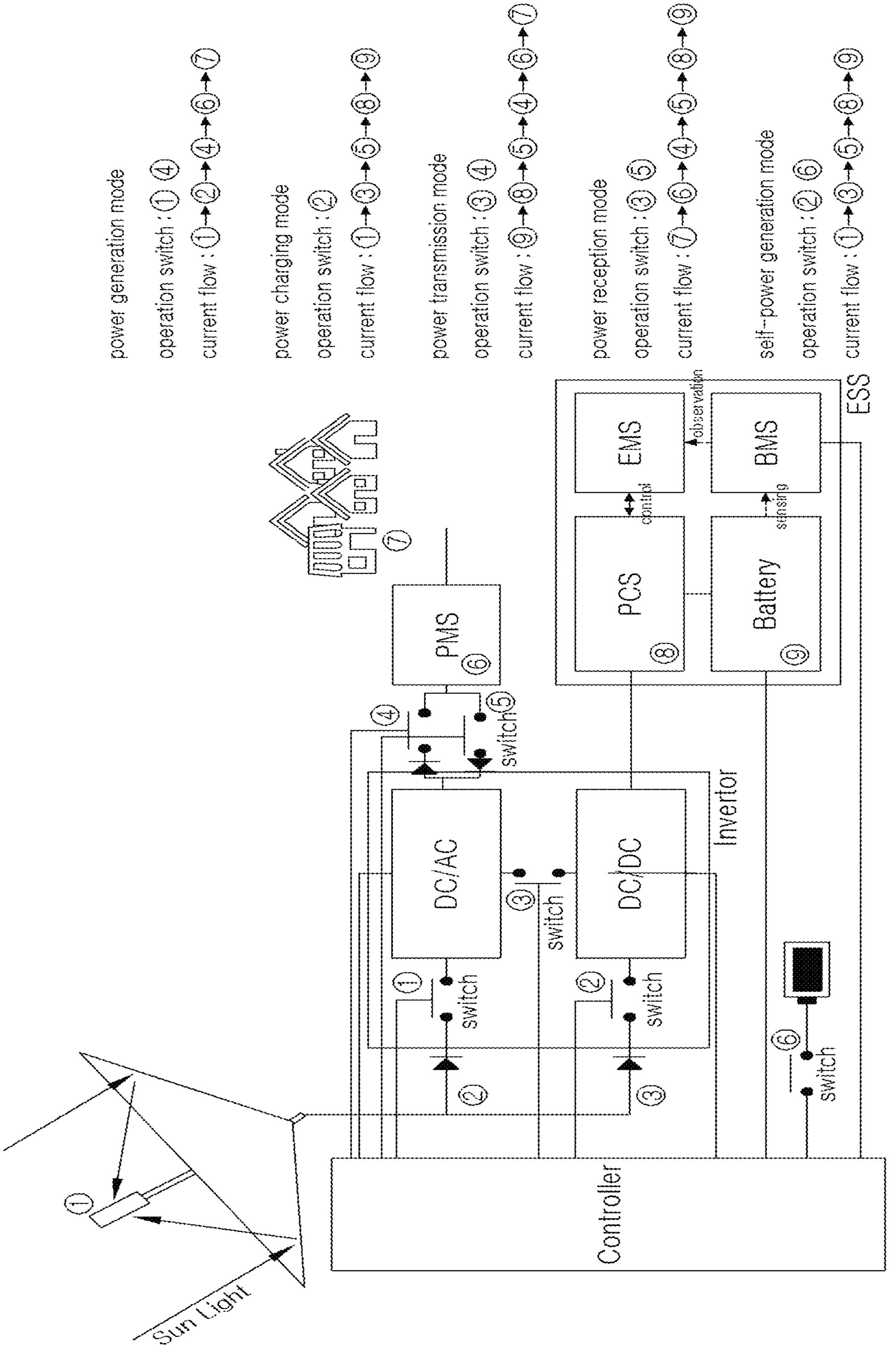
FIG. 11 is a conceptual view illustrating a power controller configured to supply power for large-scale power consumption use according to the present disclosure.

FIG. 9 is a conceptual view illustrating a power controller configured to supply commercial power for household use according to the present disclosure. FIG. 10 is a conceptual view illustrating a power controller configured to supply commercial power for power plant use according to the present disclosure. FIG. 11 is a conceptual view illustrating a power controller configured to supply power for large-scale power consumption use according to the present disclosure.

As for solar energy incident on the solar collector through the first and second exemplary embodiments, the power generation controller controls a power system according to the electric power.

Such a power generation controller is composed of an inverter, a power management system, an energy storage system, and a controller, so as to supply electric current generated in the solar collector according to each purpose of use.

The inverter has a typical configuration that enables converting and supplying the current generated in the solar collector into direct current or alternating current.

Each of a DC/AC module and a DC/DC module is disposed in such an inverter so that the supplied power is easily converted to power for commercial use or for storage.

The power management system (PMS) is configured to control power usage by predicting power consumption and use.

Such a power management system is connected to the outside and performs control on supplying and receiving electric power, etc.

The Energy Storage System (ESS) stores current generated in the solar collector.

Such an energy storage system is composed of a power conditioning system (PCS), an energy management system (EMS), a battery management system (BMS), and a battery.

The controller controls the inverter, power management system, and energy storage system so as to organically manage the converting and supplying of electric current.

In this way, through the inverter, the power generated from the solar collector is converted to meet the use of commercial power and storage power and then stored in the energy storage system.

The energy stored in this way is supplied to the outside through the power management system, and thus current converted to meet the purpose of use may be supplied.

In addition, the controller controls each component when current is stored and supplied, thereby ensuring smooth supply.

Here, the controller controls the inverter, power management system, and energy storage system, but is configured to supply or block electric power according to each component.

Accordingly, switches are arranged to block and supply current flowing through the solar collector, the DC/AC module, the DC/DC module, the power management system, and the energy storage system, thereby controlling the power to flow by controlling such switches.

In addition, the inverter may generate maximum efficiency through values of supplied current and through inverter current availability.

Power that may be handled by inverter $W_{IVMAX}$

Maximum density value of incident solar energy $D_{sunmax}$

Effective area of incident sunlight S

Photoelectric efficiency of photoelectric device used $\eta_{el}$

Light collection ratio $R_{sun}$

Considering all the above factors, $\eta_{el}R_{sun}D_{sunmax}S \leq W_{IVMAX}$ is derived.

Through these factors, it may be confirmed that the power the inverter can handle may be applied safely under the condition that the power is greater than or equal to the maximum density value of incident solar energy, the effective area of incident sunlight, the photoelectric efficiency of photoelectric device used, and the light collection ratio.

In addition, in order to maximally increase inverter efficiency, the most preferable situation is that the above-derived inequality is put into an equation.

In addition, in photoelectric devices, the voltage $V_{el}$ of each cell is fixed in principle, and as the number of cells increases, concentrated current $I_{el}$ increases.

In addition, the electric power of the inverter may be derived as $W_{IVMAX}=V_{IVMAX}I_{IVMIN}=V_{IVMIN}I_{IVMAX}=V_{IV}I_{IV}$, so it is preferable for a design to enable minimizing a voltage $V_{IV}$ of the inverter to a level of $V_{el}$ and using a lot of current $I_{IV}$ of the inverter.

In addition, it is preferable to reflect external factors such as a capacity and thickness of a power line in accordance with current increase and power efficiency generated when DC or AC current is converted to commercial voltage $V_{nom.}$ of 110V or 220V, etc.

Cell voltage $V_{el}$

Current $I_{el}$

Inverter voltage $V_{IV}$

Inverter current $I_{IV}$

Commercial voltage $V_{nom.}$

Battery charging-required voltage $V_{bat}$

Battery count $N_{bat}$

Battery-required voltage $V_{bat.tot}$

Accordingly, it is preferable to determine $V_{IV}$ so that each of a difference between $V_{IV}$ and $V_{nom.}$ and a difference between $V_{IV}$ and $V_{bat}$ becomes the smallest.

In this case, $V_{nom.}$ and an individual battery charging-required voltage $V_{bat}$ are fixed values, but a voltage $V_{bat.tot}$ required for a battery pack is determined as $V_{bat.tot}=N_{bat}V_{bat}$ in proportion to $N_{bat}$, which is the number of batteries connected in series.

In this case, the maximum value of $N_{bat}$ may vary depending on configurations, but it is preferable to determine that $V_{bat.tot}$ is as similar as possible to $V_{nom.}$ in order to minimize $\Delta_V$ $$\Delta_V = |V_{bat.tot} - V_{nom.}|.$$

In this case, designing $V_{bat.tot}$ to be smaller than $V_{bat.tot}$ results in using less $N_{bat}$, so $V_{IV}$ is designed to be as small as possible or equal to $V_{bat.tot}$, thereby establishing $V_{IV} \leq V_{bat.tot}=N_{bat}V_{bat}$.

Accordingly, in order to accurately determine $V_{IV}$, when the number of series combinations of cells $N_{el}$ is determined, a photoelectric voltage of the cells is $V_{el}$, so $N_{el}$ is determined to satisfy $$N_{el} \leq \frac{V_{IV}}{V_{el}}.$$

Number of serial combinations of cells $N_{el}$

Photoelectric voltage of cells $V_{el}$

Through the above description, the maximum efficiency may be derived when $V_{IV}$, $N_{el}$, and $N_{bat}$ are determined.

When $V_{IV}$ determined in this way is named as $$V^*_{IV},\ W_{IVMAX} = V^*_{IV}I_{IVMAX}$$

is established.

In addition, in order to satisfy $\eta_{el}R_{sun}D_{sunmax}S \leq W_{IVMAX}$, a specification of the maximum current $I_{IVMAX}$ of inverter is derived by establishing a formula below.

$$\eta_{el}R_{sun}D_{sunmax}S \leq W_{IVMAX} = V^*_{IV}I_{IVMAX}$$

$$\frac{\eta_{el}R_{sun}D_{sunmax}S}{V^*_{IV}} \leq I_{IVMAX}$$

$$\frac{\eta_{el}R_{sun}D_{sunmax}S}{V^*_{IV}} \leq \frac{\eta_{el}R_{sun}D_{sunmax}S}{N_{el}V_{el}} \leq I_{IVMAX}$$

$$\pi l^2\frac{\eta_{el}R_{sun}D_{sunmax}S}{N_{el}V_{el}}\left(\frac{1}{n}\sum_{k=1}^{n}\cos\left(\sum_{s=1}^{k}\theta_s\right)\right)^2 \leq I_{IVMAX}$$

The specification of $I_{IVMAX}$ may be determined through $$\pi l^2\frac{\eta_{el}R_{sun}D_{sunmax}}{N_{el}V_{el}^2}\left(\frac{1}{n}\sum_{k=1}^{n}\cos\left(\sum_{s=1}^{k}\theta_s\right)\right)^2 \leq I_{IVMAX}$$

established in this way.

In addition, when a solar energy density in a specific applicable area is at least $D_{sunmin}$, the minimum current $I_{IVMIN}$ entering the inverter is determined as $$\pi l^2\frac{\eta_{el}R_{sun}D_{sunmin}}{N_{el}V_{el}^2}\left(\frac{1}{n}\sum_{k=1}^{n}\cos\left(\sum_{s=1}^{k}\theta_s\right)\right)^2 \leq I_{IVMIN}.$$

Solar energy density having at least $D_{sunmin}$

Minimum current of inverter $I_{IVMIN}$

That is, a clear standard may be derived for a degree of how much $D_{sunmin}$ should be allowable.

In this way, the inverter is designed with the above conditions, and $I_{IVMIN}$ and $D_{sunmin}$ are determined according to the specification that may be driven.

Accordingly, the power generation operating time and the allowable $I_{IVMIN}$ during a day are determined by $I_{IVMIN}$.

In this regard, it is preferable to determine $I_{IVMIN}$ and $I_{IVMIN}$ according to a minimum width of a clock when the inverter satisfying the above conditions is a PWM type inverter or according to a minimum value of a current phase when the inverter is a PAM type inverter.

In this way, the inverter is able to generate power with increased efficiency through the result values that make the highest efficiency available, and is operated within a safety range, whereby various accidents and damage such as overvoltage and overcurrent may be prevented.

In addition, the power generation controller controls the generated power to be classified and supplied as power for household use, power for power plant use, and power for use of power plant connected to large power consumers.

Such a power generation controller is configured to convert a current derived at the above-described maximum efficiency of the inverter to DC/AC, and then output the current through the power management system.

In addition, as for household use, an output terminal of the power management system (PMS) is connected to commercial outlets for power such as 110V and 220V suitable for the household use.

Accordingly, the power generation controller is connected to the solar collector, and generated power is supplied according to DC/AC through the inverter.

Here, the inverter directly supplies power through the PMS to the outlets, etc., or supplies the power to the energy storage system to store the power in a battery.

In this case, the energy storage system is optionally provided with a battery management system (BMS) therein so as to enable external monitoring, and transmits monitored information to the power management system, so that the energy storage system is stably controlled.

In addition, the power generation controller operates functions of the battery management system and energy management system (EMS) in an integrated manner, thereby enabling DC/AC control.

In addition, in order to supply power for household use according to the present disclosure, as shown in FIG. 9, control is performed in five operation modes: a generation mode, a power charging mode, a power transmission mode, a power reception mode, and a self-power generation mode.

First, the power generation mode converts solar energy into electric energy and supplies the electric energy to each home.

Accordingly, as shown in FIG. 9, the electric energy generated in the solar collector through the operation of switches 1 and 4 is converted to DC/AC according to commercial power of household use through the inverter, and then supplied to each home through the PMS.

In this case, the PMS supplies power to each home through outlets, etc., so that users use the power conveniently.

In addition, the power charging mode converts solar energy into electric energy to enable internal charging.

Accordingly, as shown in FIG. 9, electric energy generated in the solar collector through the operation of switch 2 is supplied as DC/DC through the inverter so that the power is stored in the battery provided in the energy storage system.

In addition, the power transmission mode transmits the power stored in the battery to the outside through the power charging mode.

Accordingly, as shown in FIG. 9, the DC/DC power stored in the battery through the operation of switches 3 and 4 is converted into DC/AC commercial voltage through the inverter and then supplied to the outside through the power management system.

In addition, the power reception mode receives external power and charges the power in the energy storage system.

Accordingly, as shown in FIG. 9, the power applied from the outside through the operation of switches 3 and 5 is supplied through the power management system, is applied for DC/AC and/or DC/DC conversion through the inverter, and then is converted into a storable voltage before being stored in the battery.

Lastly, the self-power generation mode is operated in an operating method that is overall same as that of the power charging mode, so as to enable self-power generation power supply in a state where power is discharged during initial operation.

Accordingly, as shown in FIG. 9, the power generation controller and the controller are operated through power from a power source such as a commercial battery or spare battery separately connected through the operation of switches 2 and 6.

That is, the self-power generation mode supplies initial power to the power generation controller, which stops operation when power is blocked, thereby enabling the smooth operation.

In this way, the power generated by the solar collector is converted into power that may be used at home through the power generation controller and then easily supplied for users to use the power conveniently.

Next, as for power plant use, as shown in FIG. 10, an output terminal of the power management system is connected to the power grid including a power plant.

Here, as shown in FIG. 9, the power generation controller operates in four operation modes: the power generation mode, power charging mode, power transmission mode, and power reception mode, and the four operation modes are performed in the same manner as that of the power generation for household use.

However, it is preferable that the power generation controller determines a specification of the inverter according to commercial voltage $V_{nom.}$ and voltage to be transmitted to the power grid including the power plant.

That is, as higher power consumption and higher voltage are used than those for the household use, the inverter suitable for this specification and capable of replacing $V_{nom.}$ according to the above description is determined and then used.

In this way, the inverter applied in accordance with the power plant use may transmit overcurrent and high voltage without difficulty, thereby preventing accidents from occurring.

Lastly, as shown in FIG. 11, connection is established for the use of power plant connected to large power consumers such as housing complexes and factories.

Here, as shown in FIG. 11, the power generation controller operates in the five operation modes: the power generation mode, power charging mode, power transmission mode, power reception mode, and self-power generation mode.

Such operation modes are performed in the same manner as that of the household use.

However, the magnitude of power source used when switching to self-power generation mode, i.e., the capacity of power source, is increased to match the power for power plant use.

In addition, as for the voltage to be transmitted to large power consumers, the inverter capable of replacing $V_{nom.}$ according to the description above is determined and then used.

In this way, power may be smoothly supplied for the use of power plant connected to large power consumers such as housing complexes, factories, etc., and accidents caused by overcurrent, overvoltage, etc. may be prevented.

In this way, the power generation controller may calculate electric energy appropriate for the purpose of use of power before selecting the inverter suitable for the electric energy, thereby preventing accidents such as overvoltage and overcurrent and supplying power with high efficiency.

In addition, power is controlled according to the purpose of use, so smooth use of the power is available.

In addition, the power may be easily used through self-power generation by applying external power along with the generated power.

In addition, the power generation controller includes a machine learning system.

Such a machine learning system collects measurement data by measuring power generated by the solar collector and power supplied for the household use, power plant use, and use of power plant connected to large power consumers through the power generation controller, and generates training data by performing machine learning for power control suitable for the purpose of use in the above machine learning system on the basis of the measurement data.

In other words, the training data is collected through complex information such as electric energy that is used and charged according to each use and mode of the power generation controller.

Through the data collected in this way, the power generation controller is operated on the basis of the training data which is learned when each use and mode of the power generation controller is applied.

The above machine learning may apply ordinary machine learning models and is not particularly limited. For example, deep learning may be allowed to be performed by applying Tensorflow which is a machine learning engine developed by Google. In addition, machine learning results obtained in this way may be reflected in the power generation controller, so as to maintain power usage at optimal efficiency.

The rights of the present disclosure are not limited to the exemplary embodiments described above, but are defined by the claims, and it will be understood by those skilled in the art that various modifications in form and details may be made therein without departing from the spirit and scope of the disclosure as defined by the appended claims.

The invention claimed is:

1. A solar power generator for forming a uniform focal region, the solar power generator comprising:

a reflector configured to reflect incident sunlight and direct the sunlight to a solar collector;

the solar collector driven to receive the sunlight from the reflector; and a power generation controller for controlling electric power generated from the solar collector, wherein the reflector is configured to form a funnel shape by combining a plurality of triangular mirror surfaces whose cross section is composed of n layers in a width direction of the reflector, and a linear focal distribution ($k_n$) of the mirror surfaces satisfies Equation 14 below:

$$k_n = \frac{1}{2}(\cot\theta_n - \tan\theta_n)x_n + y_n \quad \text{[Equation 14]}$$

wherein $k_n$ indicates an upper end value of the linear focal distribution, $x_n$ indicates a width direction of an edge of n mirror surfaces, $y_n$ indicates a height direction of the edge of the n mirror surfaces, and $\theta_n$ indicates an incidence angle and reflection angle of each mirror surface.

2. The solar power generator of claim 1 wherein the reflector is composed of the n layers by dividing a total length (l) of the reflector into equal parts, the funnel-shaped reflector is configured to be folded or unfolded by adjusting an angle of each layer, and the linear focal distribution ($k_m$) of each layer corresponding to each folded part satisfies Equation 16 below:

$$k_1 = k_2 = \ldots = k_m = \frac{l}{n}\left[\frac{1}{2}\left\{\cot\left(\sum_{k=1}^{m}\theta_k\right) - \tan\left(\sum_{k=1}^{m}\theta_k\right)\right\}\sum_{k=1}^{m}\cos\left(\sum_{s=1}^{k}\theta_s\right) + \sum_{k=1}^{m}\sin\left(\sum_{s=1}^{k}\theta_s\right)\right] \quad \text{[Equation 16]}$$

wherein $k_m$ indicates an upper limit value of the focal distribution, $x_m$ indicates the width direction of the edge of the n mirror surfaces, $x_m$ indicates an end point in an x-axis direction of an m-th mirror surface of the n layers, $y_m$ indicates an end point in a y direction of the m-th mirror surface of the n layers, and $\theta_k$ and $\theta_s$ respectively indicate the incidence angle and reflection angle of each mirror surface.

3. The solar power generator of claim 2 wherein the solar collector is configured to enable position adjustment according to a focal distribution position of the reflector.

4. The solar power generator of claim 1 wherein the power generation controller is composed of an inverter, a power management system, an energy storage system, and a controller, and controls the generated electric power in consideration of power of the inverter, solar energy density, an incidence effective area, photoelectric efficiency, and a light collection ratio.

5. The solar power generator of claim 4, wherein the power generation controller controls the generated power to be classified and supplied as power for household use, power for power plant use, and power for use of a power plant connected to large power consumers.

6. The solar power generator of claim 4, wherein the power generation controller comprises a machine learning system, and the machine learning system collects measurement data by measuring the power generated by the solar collector and the power supplied, through the power generation controller, for the household use, the power plant use, and the use of a power plant connected to the large power consumers, and generates training data by performing machine learning for power control suitable for purpose of use in the machine learning system on the basis of the measurement data.

* * * * *